(12) United States Patent
Jiang et al.

(10) Patent No.: US 12,113,157 B2
(45) Date of Patent: Oct. 8, 2024

(54) METHODS OF MODIFYING THE COMPOSITION OF MATERIAL LAYERS

(71) Applicant: TECTUS CORPORATION, Saratoga, CA (US)

(72) Inventors: Hongjin Jiang, Saratoga, CA (US); William Freeman, Saratoga, CA (US)

(73) Assignee: TECTUS CORPORATION, Saratoga, CA (US)

( * ) Notice: Subject to any disclaimer, the term of this patent is extended or adjusted under 35 U.S.C. 154(b) by 15 days.

(21) Appl. No.: 18/198,005

(22) Filed: May 16, 2023

(65) Prior Publication Data

US 2023/0327059 A1 Oct. 12, 2023

Related U.S. Application Data

(62) Division of application No. 16/172,562, filed on Oct. 26, 2018, now abandoned.

(51) Int. Cl.
*H01L 33/50* (2010.01)
*H01L 27/15* (2006.01)

(52) U.S. Cl.
CPC .......... *H01L 33/508* (2013.01); *H01L 27/156* (2013.01); *H01L 2933/0041* (2013.01)

(58) Field of Classification Search
CPC .................................................... H01L 33/508
See application file for complete search history.

(56) References Cited

U.S. PATENT DOCUMENTS

| | | | |
|---|---|---|---|
| 8,349,116 B1 | 1/2013 | Bibl | |
| 9,484,504 B2 | 11/2016 | Bibl | |
| 9,865,577 B2 | 1/2018 | Bibl | |
| 2006/0040103 A1* | 2/2006 | Whiteford | B82Y 30/00 428/403 |
| 2009/0085480 A1* | 4/2009 | Sakai | H10K 50/846 313/506 |
| 2010/0068387 A1* | 3/2010 | Gibson | C09D 11/101 427/256 |
| 2013/0009129 A1 | 1/2013 | Sargent | |
| 2013/0056705 A1 | 3/2013 | Kim | |
| 2015/0041714 A1 | 2/2015 | Venkataraman | |
| 2016/0362602 A1* | 12/2016 | Xin | G03F 7/0047 |
| 2017/0153366 A1 | 6/2017 | Park | |
| 2017/0174921 A1 | 6/2017 | He | |
| 2017/0271605 A1 | 9/2017 | Steckel | |
| 2017/0309794 A1* | 10/2017 | Von Malm | H01L 25/167 |
| 2018/0006092 A1 | 1/2018 | Rieger | |
| 2018/0088261 A1 | 3/2018 | Song | |

(Continued)

OTHER PUBLICATIONS

Choi et al., "A Polydimethylsiloxane (PDMS) Sponge for the Selective Absorption of Oil from Water," ACS Applied Materials & Interfaces, American Chemical Society, 2011, vol. 3, p. 4552-4556.

(Continued)

*Primary Examiner* — Austin Murata

(57) ABSTRACT

Methods of modifying the composition of layers using selectively absorbing films are described. The composition of a layer can be modified by applying a selectively absorbing film in proximity to the applied coating and components of the layer can be selectively removed to provide a modified layers. The methods can be used to increase the concentration of particles in the layer.

13 Claims, 7 Drawing Sheets

(56) References Cited

U.S. PATENT DOCUMENTS

2018/0108303 A1    4/2018   Park
2018/0190625 A1    7/2018   Steckel
2018/0261736 A1    9/2018   Bonar
2019/0198787 A1    6/2019   Du
2020/0135988 A1    4/2020   Jiang

OTHER PUBLICATIONS

Clapp et al., "Fluorescence Resonance Energy Transfer Between Quantum Dot Donors and Dye-Labeled Protein Acceptors," J. Am. Chem. Soc, 2004, vol. 126, p. 301-310.

Lee et al., "Solvent Compatibility of Poly(dimethylsiloxane)-Based Microfluidic Devices," Analytical Chemistry, Dec. 2003, vol. 75, No. 23, pate 6544-6554.

Robb, W.L. "Thin Silicone Membranes-Their Permeation Properties and Some Applications," Annals New York Academy of Sciences, 1964, p. 119-137.

Shen et al., "Purification of Quantum Dot by Gel Permeation Chromatography and the Effect of Excess Ligands on Shell Growth and Ligand Exchange," Chemistry of Materials, 2013, vol. 25, p. 2838-2848.

* cited by examiner

METHODS OF MODIFYING THE COMPOSITION OF MATERIAL LAYERS

This application is a divisional of U.S. application Ser. No. 16/172,562 filed on Oct. 26, 2018, which is incorporated by reference in its entirety.

FIELD

The disclosure relates to methods of modifying the composition of layers and to modified layers using selectively absorbing films. The composition of a layer can be modified by applying a selectively absorbing film onto the layer and components of the layer can be removed to modify the composition of the layer. The methods can be used to increase the concentration of particles in the layer.

BACKGROUND

Viscous pastes are widely used to manufacture electronic devices. Pastes are used, for example, to deposit electrical conductors and optoelectronic elements. The viscous pastes can be applied using methods such as screen printing or roller coating. To facilitate the application process, the viscosity of the paste can be tailored to accommodate, for example, the dimensions of surface features, feature pitch, feature aspect ratio, and application speed. The viscosity can be adjusted, for example, using lower molecular weight constituents, by adding solvents, rheological control agents, and/or reactive diluents. Certain constituents can react to form part of and/or become part of a cured polymer network or binder. Other constituents are not bound to the polymeric network and, with time, can leach or outgas from the cured polymeric network. Furthermore, because these unbound constituents, which are useful in the application process, can take up a substantial volume percent of the paste, and can compromise device performance. As a result, these constituents can limit the density of particles that can be incorporated into a thin film.

It is desirable to have a method to modify the constituents of a layer after the layer has been applied or deposited onto a surface. Such methods can be used, for example, to remove constituents included in the layer to facilitate application and/or to remove constituents that may compromise device performance during use.

SUMMARY

According to the present invention, methods of modifying the composition of a layer comprise: (a) applying a selectively absorbing film in proximity to a layer, wherein the layer comprises a first composition, wherein the first composition comprises two or more components; and (b) modifying the first composition by causing at least one of the two or more components to absorb into the selectively absorbing film, causing a component to absorb into the first composition; or a combination thereof, to provide a modified layer, wherein the modified layer comprises a second composition.

According to the present invention, modified layers are fabricated using methods according to the present invention.

According to the present invention, cured modified layers are prepared by curing a modified layer according to the present invention.

According to the present invention, electronic devices comprise a cured modified layer according to the present invention.

According to the present invention, electronic systems comprise an electronic device according to the present invention.

According to the present invention, selectively absorbing films comprise one or more absorbing layers.

According to the present invention, methods of fabricating one or more pixels comprise: providing a substrate comprising one or more recesses, wherein each of the one or more recesses defines a pixel; depositing a first composition into each of the one or more recesses, wherein the first composition comprises one or more components; applying a selectively absorbing film in proximity to the deposited first composition; and causing one or more components of the deposited first composition to absorb into the selectively absorbing film, to provide one or more pixels comprising a modified first composition.

According to the present invention, pixels are fabricated using a method according to the present invention.

According to the present invention, electronic devices comprise a pixel according to the present invention.

According to the present invention, electronic systems comprise an electronic device according to the present invention.

BRIEF DESCRIPTION OF THE DRAWINGS

The drawings described herein are for illustration purposes only. The drawings are not intended to limit the scope of the present disclosure.

FIG. 4A shows a photograph of the display imaged with a 20× objective and FIG. 4B shows a portion of the display imaged with a 50× objective.

FIG. 5A shows a photograph of the display imaged with a 20× objective and FIG. 5B shows a portion of the display imaged with a 50× objective.

DETAILED DESCRIPTION

Figure 1A:
FIGS. 1A-1C shows steps in the process of modifying a deposited layer using a selectively absorbing film according to the present invention.

For purposes of the following detailed description, it is to be understood that embodiments provided by the present disclosure may assume various alternative variations and step sequences, except where expressly specified to the contrary. Moreover, other than in any operating examples, or where otherwise indicated, all numbers expressing, for example, quantities of ingredients used in the specification and claims are to be understood as being modified in all instances by the term "about." Accordingly, unless indicated to the contrary, the numerical parameters set forth in the following specification and attached claims are approximations that may vary depending upon the desired properties to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard variation found in their respective testing measurements.

Also, it should be understood that any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

The term "absorption" includes various chemical reactions with the absorbing film such as ionic or covalent bonding that can influence the mass action distribution in favor of certain of the reactive mobile species migrating into the absorbing film. Absorption can take place by active or passive mechanisms. Absorption includes gradient-induced migration into or out of an "absorbing" film. Absorption of a component can take place by one or more mechanisms or processes. For example, a component can migrate into the matrix of the absorbing film and covalently attach to the matrix. As another example, a component of a composition can migrate into an absorbing film, undergoes a catalytic reaction to release a species, and the species can subsequently migrate back into the composition. The species can be derived from the component and/or from the matrix of the absorbing film.

Viscosity refers to interrelated non-Newtonian rheological properties of a composition that can be time-dependent and/or time-independent. For example, viscosity refers to dilatant, rheopectic, and Bingham behavior.

Modified thin layers and methods of modifying thin layers are disclosed.

A thin layer on a substrate and having a first composition can be modified by applying a selectively absorbing film onto the thin layer. Constituents of the first composition can be caused to absorb into the selectively absorbing film such that the initial thin layer is modified to have a second composition, where the first composition the second composition are different. After the composition of the thin layer has been modified, the selectively absorbing film can be removed and the modified thin layer can be subjected to further processing.

A thin layer can be provided on a substrate.

A substrate can comprise a planar surface or can comprise a structured surface. A structured surface refers to a surface having topographical surface features that can be raised above and/or recessed below a nominal surface plane of the substrate. A substrate surface can have any suitable topography as appropriate for a particular application. For example, a substrate can comprise a plurality of wells recessed below the nominal surface. The wells can have any suitable dimensions. For example, the plurality of wells can have a maximum dimension in the surface plane from 1 µm to 4 µm and can have a depth with respect to the substrate surface from 1 µm to 4 µm. Each of the plurality of wells can define a volume, for example, from 1 $\mu m^3$ to 64 $\mu m^3$, from 3 $\mu m^3$ to 40 $\mu m^3$, from 6 $\mu m^3$ to 50 $\mu m^3$, or from 10 $\mu m^3$ to 40 $\mu m^3$. The wells can have any suitable geometry such as, for example, round, oval, square, rectangular, triangular, elliptical, a regular polygon, or an irregular polygon.

For example, a well can have an aspect ratio from 10:1 to 1:10, from 8:1 to 1:8, from 6:1 to 1:6, from 4:1 to 1:4, from 3:1 to 1:3, from 2:1 to 1:2, or 1.5:1 to 1:1.5.

A well can have a maximum in-plane dimension, for example, less than 5 µm, less than 4 µm, less than 3 µm, less than 2 µm, or less than 1 µm.

A well can have a depth, for example, from 1 µm to 10 µm, from 1 µm to 8 µm, from 1 µm, to 8 µm, from 2 µm to 6 µm, or from 2 µm to 4 µm.

A well can have a depth that is the same as or greater than the maximum in-plane dimension.

A substrate can be formed from any suitable material such as, for example, a metal, a semiconductor, an inorganic material, a ceramic, a thermoplastic, a thermoset, a composite, or a combination of any of the foregoing. Because the methods disclosed by the present disclosure can be carried out at room temperature (25° C.), at least with respect to the disclosed methods, the thermal properties of the substrate material are not particularly limiting. For example, a substrate may be formed of glass, metal foil, metal foil covered with dielectric, or a polymer such as polyethylene terephthalate (PET), polyethylene naphthalate (PEN), polycarbonate (PC), polyethersulphone (PES), aromatic fluorine-containing polyarylates (PAR), polycyclic olefin (PCO), and polyimide (PI). A substrate can incorporate electronic circuitry. A substrate can comprise any material or combination of materials used in the electronic industry including, for example, metals, semiconductors, dielectrics, and insulators.

A substrate can be, for example, an aluminum substrate having 2 µm×2 µm wells with a depth of 2 µm on a 5 µm pitch. A substrate can be configured to provide a display comprising a plurality of pixels.

A layer can have any suitable composition comprising two or more constituents. A layer can be continuous such as in the form of a sheet or thin film, or can be discontinuous such as in selected regions on a substrate. For example, a layer includes a layer comprising a composition deposited within wells disposed in a substrate.

A layer composition can be viscous, having an initial viscosity, for example, from 500 centipoise to 10,000 centipoise, from 500 centipoise to 8,000 centipoise, from 500 centipoise to 6,000 centipoise, or from 500 centipoise to 4,000 centipoise. A layer composition can have a viscosity, for example, greater than 500 centipoise, greater than 1,000 centipoise, greater than 2,500 centipoise, greater than 5,000 centipoise, or greater than 10,000 centipoise. A layer composition can have a relative low viscosity, such as, for example, less than 1,000 centipoise, less than 500 centipoise, less than 200 centipoise, less than 100 centipoise, or less than 50 centipoise. For example, a layer composition can have a viscosity from 1 centipoise to 1,000 centipoise, from 5 centipoise to 800 centipoise, from 10 centipoise to 600 centipoise, or from 50 centipoise to 500 centipoise. Viscosity can be measured using an Anton Paar MCR 302 rheometer with a gap from 1 mm to 2 mm at 25° C. and a shear rate of 100 $sec^{-1}$.

A thin layer can have sufficient internal integrity such that when a selectively absorbing film is applied to the surface of the layer, and subsequently removed, the modified layer remains adhered to the underlying substrate. The composition can be spreadable onto a substrate using a squeegee or other apparatus that can push the composition across a surface and into recesses. The deposition can be performed at any suitable temperature. The composition can be have a sufficiently low viscosity such that it can be spread onto a substrate or deposited onto a substrate using method used to deposit low viscosity compositions such as by ink jet printing. It can be desirable that the composition be spreadable and able fill a plurality of wells recessed into a substrate. For example, each of the plurality of wells can have a width of 2 µm×2 µm with a depth of 2 µm on a 5 µm pitch. The wells can be deeper such as can have a depth from 2 µm to 100 µm, from 2 µm to 75 µm, from 2 µm to 50 µm, or from 2 µm to 25 µm. The wells can have a width, for example, from 2 µm to 20 µm, from 2 µm to 15 µm, from 2 µm to 10 µm, or from 2 µm to 5 µm. It can be appreciated that different deposition methods and different composition viscosities, as well as other factors such as surface tension, can be selected depending on the dimensions of the wells in which the composition is to be deposited.

A layer can comprise a curable composition such as a thermoset, an inorganic composition, or a green ceramic. A curable composition can be deposited onto a substrate to form a layer and subsequently cured. Suitable cure mechanisms include, for example, actinic radiation such as UV, coreactive chemistries, latent cure mechanisms, and moisture cure mechanisms. Curing of a deposited composition can occur without an independent initiation process, or can occur using a separate initiation process such as by exposing the deposited composition to UV radiation. Cure can be accelerated, for example, by applying heat to the deposited composition A layer can comprise a composition comprising one or more constituents such as binders, curing agents, particles, solvent, reactive diluents, rheology control agents, catalysts, dispersants, light scattering agents, initiators, and combinations of any of the foregoing.

A binder can comprise an organic binder, and can include small molecules, prepolymers, and combinations thereof. Binders refer to compounds that are reactive to form a cured polymeric network or matrix. Small molecules can have a molecular weight, for example, less than 1,000 Daltons, less than 800 Daltons, less than 600 Daltons, or less than 400 Daltons, Prepolymer can have a molecular weight, for example, greater than 1,000 Daltons, greater than 2,000 Daltons, greater than 4,000 Daltons, or greater than 6,000 Daltons. The binder can include coreactive components that can be cured by heat, by actinic radiation, moisture-cure, or by dark cure mechanism. The coreactive components can be based on any suitable chemistry such as acrylate, polyurethane, polyurea, thiol/ene, Michael addition, carbonate, epoxy/thiol, or epoxy/amine curing chemistry. Suitable binders include, for example, melamines, a phenols, alkyls, epoxies, polyurethanes, maleic acids, polyamides, polymethyl methacrylates, polyacrylates, polycarbonates, polyvinyl alcohols, polyvinylpyrrolidones, hydroxyethylcellulose, carboxymethylcellulose, carboxymethylcellulose, and monomers, homopolymers, copolymers, and prepolymers of any of the foregoing. The binder can also comprise a silicone.

A copolymerizable composition can be photo-polymerizable.

A copolymerizable composition can be based on acrylate chemistry and can include acrylate monomers and/or acrylate oligomers.

A reactive diluent is a low molecular weight compound that can be used to control the rheology and during curing can become covalently bound to the polymeric network.

A catalyst can be any suitable catalyst for accelerating the chemical reaction between the binder and the curing agent. In UV-cure systems, the catalyst can be a photoinitiator.

A dispersant refers to a compound that facilitates the dispersal of particles in the composition. A dispersant prevents or minimizes agglomeration of the particles and facilitates the ability of the particles to disperse homogenously throughout the thin film composition.

Examples of suitable light scattering agents include titanium dioxide, alumina, barium sulfate, polytetrafluoroethylene, barium titanate and the like.

Examples of suitable rheology modifiers include fumed silica, treated silica, and hydrophilic silica.

A layer can be in the form of paste or in the form of an ink. For certain applications it can be desirable that a deposited layer have a high particle content. For example, in electrically conductive, electrooptic, and optoelectronic applications it can be useful to have a high particle content to increase the electrical conductivity of the layer and/or to increase the optical output of a layer. A paste can have a relatively high viscosity and an ink can be a colloidal suspension of particles.

A layer can comprise a particles. The particles can have any suitable shape, such as cylindrical, lenticular, spheroidal, planar, particulate, rod-shaped, flake, or other suitable shape. Particles can comprise organic particles, inorganic particles, metal particles, semiconductor particles, or composite particles. Particles can be thermally conductive and/or electrically conductive. Particles can be field-responsive such as, for example, photoactive or electroactive. A photoactive particle is responsive to radiation.

In certain applications, it can be desirable that an initial layer composition have a high volume percent loading of particles. For example, a high volume of a thermally conductive, electrically conductive, photoactive filler, or electroactive particles can be useful in enhancing the respective properties of a cured film fabricated using the composition. An initial layer composition can include, for example, an amount of particles from 1 vol % to 99 vol %, from 10 vol % to 90 vol %, from 20 vol % to 80 vol %, or from 30 vol % to 70 vol %, where vol % is based on the volume of the composition The amount of particles in the initial layer composition can be limited, for example, by the method used to apply the layer and/or the topography of the substrate to which the layer composition is to be applied. For example, increasing amounts of particles increase the viscosity of the layer composition, which can make it difficult to apply the composition into small substrate features. Although less viscous compositions can more easily fill small substrate features, the vol % loading of the filler is also less.

As a result, the vol % loading of filler in an initial layer composition can be less than is desired for the final cured film. For example, it can be desired that the final cured film have a vol % loading of particle greater than 50 vol %, greater than 60 vol %, greater than 70 vol %, greater than 80 vol %, greater than 90 vol %, greater than 95 vol % or greater than 99 vol %. However, due to constraints associated with the application method and/or the surface topography, it may not be possible to obtain the desired particle loading for the final product in the initially deposited layer.

A layer can be applied to a substrate using any suitable method. For example, the layer can be applied by spraying, by dip-coating, by ink-jet printing, by roller-coating, by spin-coating, by transfer-printing, by spreading, or by any other suitable method. An appropriate method can be determined by, for example, the viscosity of the material being applied and by the topography of the surface being coated.

An applied layer can have any suitable thickness as appropriate for a particular application. For example, an applied layer can have a thickness, less than 100 µm, less than 50 µm, less than 30 µm, less than 20 µm, less than 10 µm, or less than 5 µm. A layer can have a thickness, for example, from 0.5 µm to 100 µm, from 1 µm to 50 µm, from 2 µm to 20 µm, or from 2 µm to 10 µm. The applied layer can be continuous such as have a substantially constant thickness across a planar surface. An applied layer can be discontinuous such that the layer only covers a portion or portions of a surface. A discontinuous layer can cover portions of a planar surface. A discontinuous layer can cover or fill recesses in the substrate and the nominal planar surface can have substantially no layer.

An applied layer can have any suitable thickness. The layer can be relatively thin such that a selectively absorbing film can modify the coating throughout the thickness of the layer. For example, a thin layer can have a thickness less than 5 µm, less than 4 µm, less than 3 µm, less than 2 µm or less than 1 µm. In certain applications, it can be desirable that only the top surface of the layer be modified. In these applications a thicker coating can be used.

A selectively absorbing film includes one or more layers configured to absorb one or more materials from a layer deposited on a substrate. By selectively absorbing is meant that the two or more materials forming the layer are not equally absorbed by the selectively absorbing film. For example, some materials forming the layer may be absorbed by the selectively absorbing film and other materials may exhibit no appreciable absorption or only limited absorption. Some materials may absorb at a faster rate into the selectively absorbing film, while other materials may have a relatively slower rate of absorption. Thus, when a selectively absorbing film is applied to a layer, over a period of time, certain constituents of the layer will be preferentially absorbed by the selectively absorbing film, compared to other constituents. Selective absorption can refer to selective absorption of small molecules. For example, a solvent can be absorbed and monomeric binders, rheology modifiers and/or other materials may not be absorbed. For example, small molecules such as monomers may be absorbed and larger molecules such as prepolymers may not be absorbed. For example, a selectively absorbing film can selectively absorb molecules based on molecular weight and/or by physical size. As another example, organic components of a composition such as solvents, binders, and others may be absorbed, possibly at different rates, and particles may not be absorbed by the selectively absorbing film. The selectively absorbing film may absorb all small molecules in a composition, at least to some extent, and not absorb the particles. In this way, particles can become concentrated in the layer.

A selectively absorbing film can include a single layer or can include multiple layers. The layers of a selectively absorbing film can be selected based on absorptive properties, absorption control properties, and/or physical properties. An absorbing layer can be selected, for example, to absorb molecules based on size, polarity, hydrophobicity, hydrophilicity, or a combination of any of the foregoing. Examples of layers selected based on physical properties include a support layer that provides structural support. Each of the multilayer layers can independently have a different thickness.

A selectively absorbing film can include a single layer. A single layer of a selectively absorbing film can have a surface that does not adhere to the deposited layer to be modified and that selectively absorbs small molecules and does not adhere to the deposited layer and/or to particles within the deposited layer.

Examples of suitable materials for single layer selectively absorbing films include silicones, polymers having intrinsic micro-porosity, metal-organic frameworks, and porous coordination polymers.

A multilayer selectively absorbing film can include, for example, a porous layer that does not adhere to the deposited layer. A porous layer can exclude molecules based on molecular weight and or size. Examples of such porous materials include silica, polystyrene-divinyl benzene, and alumina. One or more absorbing films can overly the porous layer. Porous layers, absorbing layers, and selectively absorbing layers can be interspersed throughout a multilayer selectively absorbing film.

A selectively absorbing film can have any suitable thickness. A suitable thickness can be determined, for example, by the amount of material to be absorbed, the topography of the surface on which the material layer is deposited, on the method used to apply the selectively absorbing film to the coating, and on the desired structural integrity. To facilitate the ability of a selectively absorbing film to conform to surface topography it can be desirable that a an absorbing film be thin.

Figure 2A:
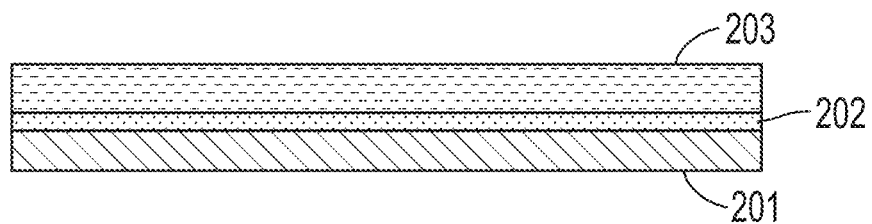
FIG. 2A shows a multilayer selectively absorbing film applied to a layer.
Figure 2B:
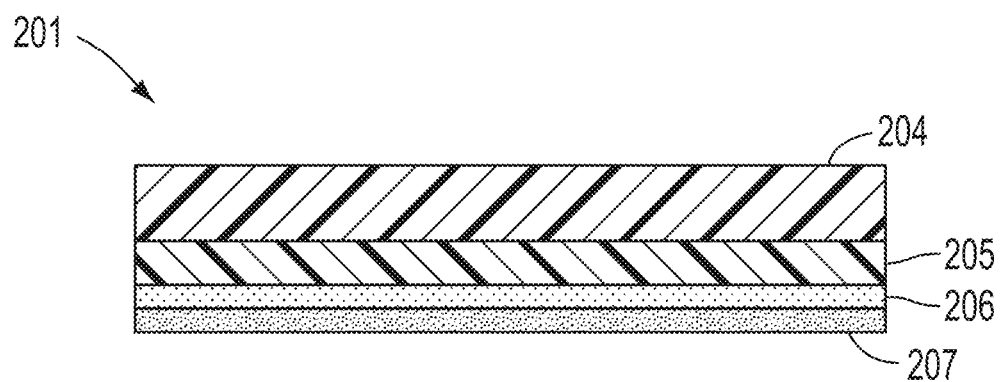
FIG. 2B shows a detailed view of an example of a multilayer selectively absorbing film.

FIG. 2A shows a multilayer selectively absorbing film 201 applied to a material layer 202 on a substrate 203. An example of a multilayer selectively absorbing film 201 is shown in FIG. 2B. The selectively absorbing film shown in FIG. 2B includes support layer 204, a first absorbing layer 205, a second absorbing layer 206, and a release layer 207. Support layer 204 provides structural integrity to the selectively absorbing film and can determine the mechanical properties of the film. For example, the support layer 204 can be flexible to facilitate the ability of the film to conform to a topography of an underlying surface. The support layer 204 can be substantially rigid to facilitate the ability of a load applied to the film to be distributed evenly across the plane of an underlying surface.

A support layer can comprise any suitable material that provides mechanical integrity and that can facilitate handling of the selectively absorbing film.

First absorbing layer 205 can be configured to absorb molecules that are able to pass through the second absorbing layer 206. For example, molecules absorbed by the first absorbing layer 205 can have a smaller physical size than molecules capable of being absorbed by the second absorbing layer 206.

The second absorbing layer 206 can be permeable to molecules absorbed in the first absorbing layer. A second absorbing layer 206 may not absorb molecules to a significant extent but can serve as a porous membrane that allows molecules to easily pass through the layer and into the first absorbing layer, where the molecules become sequestered.

The bottom layer 207 can be a porous layer that allows molecules to pass through and into the overlying layers. The bottom layer 207 can also function as a release layer and can be configured to not adhere to the underlying surface.

A selectively absorbing film can comprise, for example, from 1 to 10 layers, from 1 to 6 layers, from 1 to 4 layers, or from 1 to 2 layers. A selectively absorbing film can comprise, for example, 1, 2, 3. 4, 5, 6, 7, 8, 9, or 10 layers.

The thickness a layer of a selectively absorbing film can be, for example, from 100 µm to 1,200 µm, from 200 µm, to 1,000 µm, from 300 µm to 800 µm, or from 400 µm to 600 µm.

A bottom layer can be uniform within the plane.

For certain applications, a bottom layer can be non-uniform within the plane.

The bottom layer of a selectively absorbing film can be treated to control absorption of materials in a layer and/or to prevent or to minimize adhesion of the absorbing film to materials in the layer.

For example, the bottom layer can be physically structured such that the bottom layer does not have a uniform thickness. For example, the bottom layer can include depressions and or cavities. A physically structured bottom surface can be used tailor the absorptive properties of the film to provide a structured modified layer, such that the structured modified layer has non-uniform properties and/or composition within the plane of the layer. A physically structured bottom layer can facilitate contact of the selectively absorbing film with a layer deposited within a cavity; or conversely a physically structured bottom layer can prevent or minimize contact of the selectively absorbing film with certain regions of the layer.

A bottom layer can have non-uniform physical and/or material properties within the plane of the film. For example, with the plane of the film, certain regions can be permeable to molecules within the deposited layer, and in other regions within the plane of the film, the film can be impermeable to molecules within the deposited layer. Non-uniform regions can be fabricated, for example, by changing the cross-linking density of the polymeric network of the bottom layer of the selectively absorbing film.

A bottom layer of a selectively absorbing film can comprise a mask in which desired areas are removed to provide access to a deposited layer. The mask material may be impermeable, partially permeable, or selectively permeable with respect to certain or all constituents of the layer.

An absorbing layer can comprise a semipermeable material such as, for example, silicones, non-isocyanate polyurethanes cellular polyurethanes, polyacrylic acids, and polyethylene glycols. The semipermeable material can be in the form of sponges, hydrogels or porous membranes. For example, silicones such as polymethyl siloxanes are known to absorb non-polar solvent such as hydrocarbons, toluene and dichloromethanol, An selectively absorbing layer can be a porous layer and can be made from materials that can separate materials by size.

A selectively absorbing film can be configured to selectively transport molecules from a deposited layer based on molecular size, surface energy, steric hindrance or a combination of any of the foregoing.

Selectively absorbing films can be field-responsive. A field-responsive selectively absorbing film refers to a film in which the properties can be dynamically changed while the film is applied to a layer. For example, an external field such as an electrical, optical, microwave, inductive, or thermal field can be applied to change a property of the selectively absorbing film or change a property of a portion of a selectively absorbing film. The application of an external field can change the pore size of one or more layers of the film. In another example, a layer of the film can include molecules that change conformation, for example by absorption of radiation, and can thereby change the transport properties of a film. Other molecules responsive to external fields include liquid crystals and/or rotoxanes. Photoisomerization can be used to control the transport properties of a film and/or can be used to monitor the film. For example, it can be useful to actively monitor the absorption of materials into the film to quantify the amount of material being removed from the coating. In can be desirable to monitor the absorption process. For example, this can be accomplished using optical methods.

When a selectively absorbing film is applied to a coating a concentration gradient can be produced such that components of the coating can passively diffuse into the area of low concentration within the selectively absorbing film. A selectively absorbing film can change volume when in contact with certain materials that can cause the absorbing film to swell.

A selectively absorbing film can be formed from a material having a free volume that allows certain components to pass through and/or be absorbed into the absorbing layers.

One or more absorbing layers of a selectively absorbing film can include a solvent. The presence of a solvent in an absorbing film can facilitate the ability of a component to diffuse into the absorbing layers. A solvent can be selected to preferentially solubilize a component or multiple components of the coating. A solvent can be selected to modify the pore volume of an absorbing layer. For example, certain solvents can cause a polymeric material to swell.

The presence of a solvent in a selectively absorbing layer can also maintain the integrity of the interface between the selectively absorbing film and the coating during the absorption process. For example, as materials are removed from the deposited layer and absorbed into the selectively absorbing film, solvent from the absorbing film can transfer into the interface and/or transfer into the deposited layer.

A selectively absorbing film can be applied by any suitable method. The method can include applying pressure to the selectively absorbing film or may not involve applying pressure to the selectively absorbing film. If pressure is applied, the pressure may be applied selectively across the surface or may entail applying pressure in certain regions across the surface. The pressure may be applied to facilitate the ability of the selectively absorbing film to physically contact a coating. A selectively absorbing film may, when applied to the deposited layer, have sufficient contact that it is not necessary to apply pressure to the selectively absorbing film.

A selectively absorbing film can be applied to a substrate using, for example, a platen, may be rolled onto the coating, may be applied by vacuum, by spraying, or by spin coating. Applying a selectively absorbing film in the form of a liquid or low-viscosity material can facilitate the ability of the selectively absorbing film to conform to surface topography. For example, when a layer is disposed within small-dimensioned wells, a solid film may not be able to sufficiently conform to enable contact with material disposed within a well. Alternatively, a low viscosity, curable composition can be applied to the substrate such that the curable composition fills the wells and contacts the deposited layer within the wells. The low viscosity, curable composition can then be cured in place to provide a selectively absorbing film.

A selectively absorbing film having multiple layers may be applied as a single film.

A selectively absorbing film having multiple layers can be applied such that one or more of the multiple layers are applied sequentially or at different times. For example, a first layer can be applied and materials from the coating allowed to absorb into the first absorbing layer. Then, a second absorbing layer can be applied onto the first absorbing layer and materials allowed to absorb into both the first and second absorbing layers. This can be useful to produce a concentration gradient that can facilitate the ability of materials to be absorbed into the selectively absorbing film.

Furthermore, rather than use a selectively absorbing film configured to absorb several materials having different properties, it can be useful to have a variety of selectively absorbing films with each film configured to optimize the absorption of a particular material or materials from the coating. A first selectively absorbing film can be applied to the layer, and a first material or materials allowed to absorb into the first film. The first film can then be removed and a second absorbing film applied to the first modified layer, a second material or materials allowed to absorb into the second film, to provide a second modified layer.

To facilitate the ability of a selectively absorbing film to contact an underlying layer, a solution may be applied to the coating and/or onto the bottom surface of the selectively absorbing film to provide an interfacial layer. Particularly when the surface topography of the deposited layer is non-planar, such as in recesses or wells on a substrate, the ability of the selectively absorbing film to contact the layer can be facilitated by the presence of an interfacial layer. The interfacial layer can be formed of a material in which molecules that are intended to be absorbed are soluble and therefore allows the molecules to flow from the layer, across the interface, and into the selectively absorbing film. The solution can also facilitate the ability of the selectively absorbing film to maintain functional contact with the layer as components of the layer are removed and the volume of the layer decreases. This can be useful, for example, when a layer is within a recess where it may be difficult to establish and maintain physical contact between the layer and the selectively absorbing film. The interface solution can comprise a volatile material to facilitate removal of the interface after the selective absorption process is complete.

A selectively absorbing film can be a film provided in the form of a sheet or multiple sheets of material. The sheets can be prepared by any suitable method such as, for example, by extrusion, casting, or laminating. A porous adhesive layer can be used to bond adjacent films.

A selectively absorbing film can be provided as a system including multiple separate or combined films that can be applied separately and/or at different times during the process. For example, a porous layer can be applied to the deposited layer and overlying films can be added and/or removed.

A selectively absorbing film can be applied to a layer as a liquid, which can be allowed to set or cure in place. The liquid material can be applied, for example, using a spray, spin coating, roller coating, or spreading. After a first selectively absorbing material has been applied as a liquid and cured to a provide a thin film, subsequent overlying films can be applied either as solid films or from a liquid. An advantage of applying a selectively absorbing film as a liquid or low viscosity material is that the liquid can more readily conform to the surface topography. For example, a liquid film can fill recesses in a substrate and thereby make physical contact with a layer, at least initially, within a recess.

After a selectively absorbing film is applied to a deposited layer, one or more components of the layer can be allowed to diffuse into the selectively absorbing film.

The diffusion can take place at room temperature (25° C.) or at higher temperatures. For example, the absorption can take place at temperatures less than 50° C., less than 40° C., less than 30° C., or less than 25° C. Although higher temperatures can reduce the viscosity of the deposited composition and in principle facilitate the selective absorption process, higher temperatures can also accelerate thermal curing reactions. Therefore, a suitable temperature can be selected based on the materials used and the dynamics of the selective absorption process A slight pressure can be applied to the selectively absorbing film, or no pressure can be applied. A slight pressure can be useful to facilitate physical contact between the deposited layer and the selectively absorbing film. However, compressing the absorbing film can also reduce the free volume.

The slight pressure can be applied continuously, intermittently, or repeatedly. For example, the pressure applied can be varied at different times to maintain contact between the selectively absorbing film and the deposited layer and/or to create a pumping action that can facilitate the ability of components of the deposited layer to move into the selectively absorbing film.

To facilitate transport of the components during absorption a the assembly can be vibrated. Vibration, including frequencies from subsonic through ultrasonic, can help to reduce adhesion and facilitate mixing of a deposited composition and facilitate transport of the absorbed components into and through the layer(s) of the selectively absorbing film.

To facilitate transport of components during absorption a vacuum can be applied to the top surface of the selectively absorbing film.

Figure 1B:
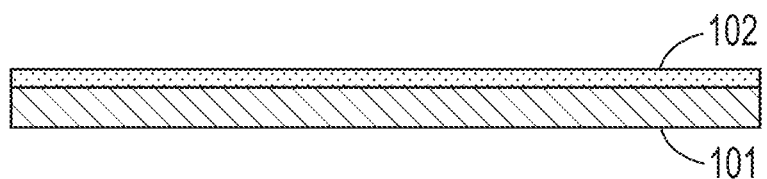
Figure 1C:
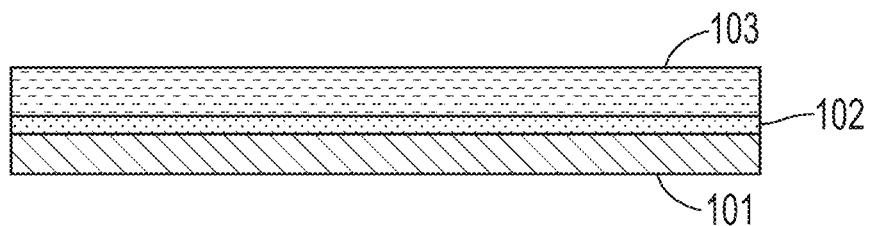

An example of the process steps for modifying a deposited thin film using a selectively absorbing film provided by the present disclosure is described in the following paragraphs and certain aspects are illustrated in FIGS. 1A-1C. FIGS. 1A-1C show a substrate 101, a deposited material layer 102 applied to the substrate 101, and a selectively absorbing film 103 applied to the material layer 102.

First, a substrate having a deposited layer to be modified is provided. A substrate can be a planar surface or can have a surface topography. For example, a substrate surface can comprise elevations and/or depressions. The layer can have a substantially constant thickness across the substrate surface, or can have a varying thickness across the substrate surface. A substrate surface can comprise a plurality of depressions or cavities, and the plurality of depressions or cavities can be filled, entirely or partially, with the material layer.

A selectively absorbing film can be applied onto the surface of the layer. The selectively absorbing film can be applied to the layer by any suitable method, which can in part be determined by the physical properties of the film. For example, a flexible film can be rolled across the surface of the coating or can be applied as a planar sheet of material onto the surface of the layer. The film may be applied to the layer with minimal pressure. In certain embodiments, the film may be applied to the layer with a suitable pressure. It may not necessary that the selectively absorbing film be applied to the deposited layer with a pressure to facilitate selective absorption. Application of a slight pressure can serve to facilitate physical contact between the film and the layer, both initially and during the absorption process.

In embodiments in which the selectively absorbing film is structured, within the plane of the film and/or orthogonal to the plane of the film, the selectively absorbing film can be aligned with substrate features and/or coating features before being applied to the deposited layer.

A selectively absorbing film can be substantially homogenous within the plane of the film. For example, any cross-section of the film orthogonal to the plane of the film, can have the same physical structure and material properties across the profile. An example of a homogeneous selectively absorbing film is a selectively absorbing film comprising multiple planar material layers that have been laminated together to form a single sheet. When applied to a deposited layer that has a homogeneous physical structure and material composition within the plane, the selectively absorbing film and the deposited layer can interact uniformly to provide a modified coating having substantially uniform properties and composition.

A structured selectively absorbing film can be used to provide a modified coating that has non-uniform properties and composition within the plane of the modified coating. For example, after a layer having a substantially uniform composition is applied to a surface of a substrate, it can be desirable to modify the applied layer in certain regions to provide a chemically structured layer. This can be accomplished by applying a structured selectively absorbing film onto the uniform layer. The structured absorbing film can be configured to have regions or areas with different absorptive properties such that after being applied to a layer having homogeneous composition, following the non-uniform selective absorption, the modified layer will have a structured chemical composition.

Selectively absorbing films and methods of using the selectively absorbing films can be used, for example, to remove components from a deposited coating, to increase the density or volume percent (vol %) of particles within a deposited layer, and/or to introduce components into the deposited layer.

For example, a layer composition can comprise hydrophobic or hydrophilic solvents to decrease the viscosity. A selectively absorbing film can selectively absorb the small size, low molecular weight, solvent molecules from the composition.

For example, UV curable compositions can be initiated by free radical mechanisms and UV free radical photoinitiators can be employed in such systems to catalyze UV cure. To some extent, these reactions can be initiated by room lighting. To control the cure of UV curable systems, it can be desirable to introduce the UV-sensitive free radical imitators after the UV curable composition is applied to a surface. This can be accomplished, for example, by loading a selectively-permeable film provided by the present disclosure with a UV photoinitiator into the composition after it has been applied to a substrate. Under suitable conditions the UV-photoinitiator can diffuse from the permeable film and into the applied composition.

A selectively-permeable film can also be used to impart properties to the surface of a deposited layer the that are not necessarily present throughout the thickness of the coating. For example, in certain applications it can be desirable that the surface of a coating have a hardness, solvent resistance, optical property such as reflectivity or scattering, or coloring, which may be different than the rest of the deposited layer.

To accomplish this, for example, low molecular weight cross-linking agents can be diffused into the surface of the deposited layer in contact with the selectively absorbing film.

Vacuum can be used to extract volatile components after a thin layer is applied to a surface. However, not all components are volatile, and the high viscosity of the coating can prevent or reduce diffusion of the volatile component to the layer surface.

A permeable film provided by the present disclosure can be used to exchange components with an applied composition. For example, a permeable film can be used to introduce a component into the applied composition and can be used to extract one or more components from the applied composition.

A selectively absorbing film can be used to introduce components into a layer.

A selectively absorbing film can comprise one or more unbound components incorporated into one or more of the layers forming the selectively absorbing film. A material in the absorbing film can diffuse into the layer.

A layer can have a relatively high viscosity such as in the form of a paste and have a relatively high concentration of filler. Such materials can have a relatively high vol % of particles. For example, for a well filled with a composition having a particle content of 50 vol % and assuming that 75% of the carrier can be removed, after the absorption process 37.5 vol % of the well is free, where vol % is based on the volume of the well. A second layer can be applied to fill the volume, thereby increasing the particle content of the well from 50 vol % to 68.75 vol %.

A deposited layer can have a relatively low viscosity such as in the form of an ink. For an ink, the vol % particles can be about 10 vol %, such as from 5 vol % to 20 vol %. Repeated use of a selectively absorbing film to remove the carrier can result in a substantial increase in the vol % loading of the particles in the layer.

A selectively absorbing film can incorporate a non-functional exchange material. By non-functional is mean that the material does not have a specific function in the modified composition such as acting as a binder or a catalyst. A non-functional exchange material can be used to fill and restore the free volume created by the absorbed components. For example, for a layer deposited in a well, when 50 vol % is removed by the absorbing film, at some point during the absorption the vacuum force will offset the absorbing force thereby preventing further absorption. To prevent or minimize this phenomenon, a non-functional material initially in the absorbing layer can diffuse into the well and effectively exchange with the absorbed components. It can be desirable, for example, that the non-functional exchange material have a low vapor pressure to facilitate subsequent removal from the modified coating.

A deposited composition can include a component that facilitates the ability of the deposited composition to form a deposited layer and/or to conform to substrate surface topography, and the can be readily absorbed by the selectively absorbing film. For example, such a component can be preferentially absorbed by the selectively absorbing film, and the selectively absorbing film can be engineered to facilitate the absorption of the component. Using such co-engineered combinations of layer components and the selectively absorbing film, the composition of the modified layer following the selective absorption process can be more intentionally controlled.

A non-functional exchange material can also serve the purpose of maintaining functional contact between the deposited layer and the absorbing film as the volume of the deposited layer decreases during the extraction process. To facilitate removal of the non-functional material, it can also desirable that the non-functional exchange material do appreciably diffuse into the modified layer. Therefore, a non-functional exchange material can be selected to have a low solubility with the non-absorbed materials in the modified layer.

Methods provided by the present disclosure can be used to modify the composition of a layer after it is deposited onto a surface.

Depending on the method of application a composition can include components that facilitate the deposition process but that are either not useful or not desired in a cured product.

For example, compositions can include additives such as solvents and rheology modifiers that are useful to reduce the viscosity and/or improve the ability of a layer to fill a surface topography.

Such additives may not bind to a cured network and may leach from the matrix with time.

In can be desirable that these additives be removed from the layer.

Methods provided by the present disclose can be used to increase the concentration of a filler within a volume. Due to surface adhesion, fillers can significantly increase the viscosity of a composition, placing limits on the vol % loading of a particular type of particle can be used with a particular application method. Again, additives such as solvents and rheology modifiers can be incorporated into a composition comprising particles, and it can be useful that these additives be removed, whether or not an objective is to increase the vol % loading of the layer in a layer.

Alternatively, rather than fill the removed volume with a solvent, the volume can be filled with air. The selectively absorbing film can be sufficiently porous such that air can pass through the film to fill the decreasing volume. In this scenario, continued extraction of components from the layer can take place at the meniscus.

A modified layer can have a concentration of low molecular weight components, hydrophobic components, hydrophilic contents or combinations of any of the forgoing that is less than the concentration of the respective components in the initial as-applied, deposited layer.

A modified coating can occupy a volume that is less than the respective volume of the initial layer.

A modified layer can have a higher vol % particle content than the vol % particle content of the applied layer, wherein vol % is based on the volume of the relevant layer or portion thereof.

A layer may be designed to be modified by one or more the absorbed components. For example, a saponin or fatty acid in the layer can bind to the matrix of the absorbing film through a hydrophilic moiety, resulting in the hydrophobic end being presented to the interior of the channels or pores of the matrix thereby rendering the matrix more hydrophobic. This can result in tailoring the properties of the matrix in a sequential fashion such that a hydrophobic surface becomes hydrophilic during the absorption process. This change in properties may be used to limit or augment the absorption of other components or can be used as a selective gate that maintains a hydrophobic molecule in an absorbing layer more remote from the deposited layer from diffusing into the deposited layer until after the molecule that alters the hydrophobicity of the more proximal layer is absorbed from the deposited layer.

An initial, as deposited, thin layer can have no particles, or can have a particle content, for example, from 1 vol % to 99 vol %, such as from 5 vol % to 95 vol %, 10 vol % to 90 vol %, 15 vol % to 85 vol %, 20 vol % to 80 vol %, or from 20 vol % to 70 vol %.

A particle can include organic particles, inorganic particles, ceramic particles, metal particles, semiconductor particles, or a combination of any of the foregoing.

Examples of suitable organic particles include thermoplastics, thermosets, or a combination thereof. Examples of suitable organic particles include epoxies, epoxy-amides, ETFE copolymers, polyethylenes, polypropylenes, polyvinylidene chlorides, polyvinylfluorides, TFE, polyamides, polyimides, ethylene propylenes, perfluorohydrocarbons, fluoroethylenes, polycarbonates, polyetheretherketones, polyetherketones, polyphenylene oxides, polyphenylene sulfides, polyether sulfones, thermoplastic copolyesters, polystyrenes, polyvinyl chlorides, melamines, polyesters, phenolics, epichlorohydrins, fluorinated hydrocarbons, polycyclics, polybutadienes, polychloroprenes, polyisoprenes, polysulfides, polyurethanes, isobutylene isoprenes, silicones, styrene butadienes, liquid crystal polymers, and combinations of any of the foregoing.

Examples of suitable inorganic particles include carbon black, calcium carbonate, precipitated calcium carbonate, calcium hydroxide, hydrated alumina (aluminum hydroxide), fumed silica, silica, precipitated silica, silica gel, and combinations of any of the foregoing. For example, an inorganic particle can include a combination calcium carbonate and fumed silica, and the calcium carbonate and fumed silica can be treated and/or untreated. An inorganic filler can comprise calcium carbonate and fumed silica. An inorganic filler can be coated or uncoated. For example, an inorganic filler can be coated with a hydrophobic material, such as a coating of polydimethylsiloxane. Inorganic fillers useful in compositions include carbon black, calcium carbonate, precipitated calcium carbonate, calcium hydroxide, hydrated alumina (aluminum hydroxide), fumed silica, silica, precipitated silica, silica gel, and combinations of any of the foregoing. For example, an inorganic filler can include a combination calcium carbonate and fumed silica, and the calcium carbonate and fumed silica can be treated and/or untreated.

Examples of suitable ceramic particles include zirconium dioxide, boron carbide, silicon nitride, hydroxyapatite, alumina, and aluminosilicates.

Suitable particles include low-density particles, electrically conductive particles, optically response particles, or a combination of any of the foregoing. Low density particles can have, for example, a specific gravity less than 1.0, less than 0.75, or less than 0.5.

Examples of suitable electrically conductive particles include copper, nickel, silver, aluminum, tin, nickel powder, graphite, nickel-coated graphite, stainless steel, or a combination of any of the foregoing. Electrically conductive fillers also include high band gap materials such as zinc sulfide, inorganic barium compounds, zinc oxide, tin oxide, and combinations of conductive particles. Other examples of electrically conductive fillers include electrically conductive noble metal-based fillers such as pure silver; noble metal-plated noble metals such as silver-plated gold; noble metal-plated non-noble metals such as silver plated cooper, nickel or aluminum, for example, silver-plated aluminum core particles or platinum-plated copper particles; noble-metal plated glass, plastic or ceramics such as silver-plated glass microspheres, noble-metal plated aluminum or noble-metal plated plastic microspheres; noble-metal plated mica; and other such noble-metal conductive fillers. Non-noble metal-based materials can also be used and include, for example, non-noble metal-plated non-noble metals such as copper-coated iron particles or nickel-plated copper; non-noble metals, e.g., copper, aluminum, nickel, cobalt; non-noble-metal-plated-non-metals, e.g., nickel-plated graphite and non-metal materials such as carbon black and graphite. Combinations of electrically conductive fillers can also be used to meet the desired conductivity, EMI/RFI shielding effectiveness, hardness, and other properties suitable for a particular application.

Particles can include pigment, phosphors, electroactive particles, magnetic particles, quantum dots, nano-diamonds, photonic crystals, and combinations of any of the foregoing.

A phosphor refers to any type of wavelength converting material capable of absorbing light of at least one wavelength and capable of emitting light at another wavelength. Examples of phosphors include quantum dots, which are semiconductor materials having a size, composition, and structure in which the electrical and optical characteristics differ from the bulk properties due to quantum confinement effects. Fluorescence of quantum dots results from the excitation of a valence electron by light absorption, followed by the emission at a lower energy wavelength as the excited electrons return to the ground state. Quantum confinement causes the energy difference between the valence and conduction bands to change depending on the size, composition and structure of a quantum dot. For example, the larger the quantum dot, the lower the energy of its fluorescence spectrum. The photoluminescence emission wavelength of a quantum dot can have a sharp emission spectrum and exhibit a high quantum efficiency.

Quantum dots can have any suitable geometry such as, for example, rods, disks, prolate spheroids, and crystalline, polycrystalline, or amorphous nanoparticles that can convert light at a suitable wavelength or range of wavelengths, absorb selected wavelengths of light, and/or convert one form of energy into another.

Examples of quantum dot semiconductor materials include, for example, Groups II-VI, III-V, IV-VI semiconductor materials. Suitable quantum dot materials include CdS, CdSe, CdTe, ZnS, ZnSe, ZnTe, GaAs, GaP, GaAs, GaSb, HgS, HgSe, HgTe, InAs, InP, InSb, AlAs, AlP, and AlSb. Other examples of suitable quantum dot materials include InGaP, ZnSeTe, ZnCdS, ZnCdSe, and CdSeS. Multicore structures are also possible. Examples of multicore quantum dot configurations include a quantum dot having a semiconductor core material, a thin metal layer to protect the core from oxidation and to facilitate lattice matching, and a shell to enhance the luminescence properties. The core and shell layers can be formed from the same material, and may be formed, for example, from any of the listed semiconductor materials. A metal layer can comprise Zn or Cd.

Ligands can be bound to quantum dots, for example, to promote ligands to promote solubility of the quantum dots in the polymerizable composition, which can provide for higher vol % loadings without agglomeration. Ligands can be derived from a coordinating solvent that may be included in the reaction mixture during the growth process. Examples of suitable ligands include fatty acid ligands, long chain fatty acid ligands, alkyl phosphines, alkyl phosphine oxides, alkyl phosphonic acids, alkyl phosphinic acids, pyridines, furans, and amines. Specific examples include pyridine, tri-n-octyl phosphine (TOP), tri-n-octyl phosphine oxide (TOPO), tris-hydroxylpropylphosphine (tHPP) and octadecylphosphonic acid ("ODPA"). Technical grade TOPO can be used.

Examples of other phosphor particles include phosphors that intrinsically exhibit photoluminescence because of the composition. Examples of phosphor particles that exhibit luminescence due to the composition include sulfides, aluminates, oxides, silicates, nitrides, YAG (optionally doped with cerium), and terbium aluminum garnet (TAG) based materials. Other exemplary materials include yellow-green emitting phosphors: $(Ca,Sr,Ba)Al_2O_4$:Eu, $(Lu,Y)$ $3Al_5O_{12}$: $Ce_3^+$(LuAG, YAG), $Tb_3Al_5O_{12}$:$Ce^{3+}$(TAG); orange-red emitting phosphors: $BaMgAl_{10}O_{17}$:$Eu^{2+}(Mn_2^+)$, $Ca_2Si_5N_8$: $Eu^{2+}$, $(Zn,Mg)S$:Mn, $(Ca,Sr,Ba)S$:$Eu^{2+}$; UV-deep blue absorbing phosphors for blue and yellow-green emission: $(Mg,Ca,Sr,Ba)_2SiO_4$:$Eu^{2+}$, $(Mg,Ca,Sr,Ba)_3Si_2O_7$:$Eu^{2+}$, $CaSMg(SiO_4)_4Cl_2$:$Eu^{2+}$; and phosphors that can emit over the full visible spectrum depending on composition and processing $(Sr,Ca,Ba)Si_xO_yN_z$:$Eu^{2+}$, $Y_2O_2S$:$Eu^{3+}$, $(Ca,Mg,Y)_vSi_wAl_xO_yN_z$:$Eu^2$. A phosphor particle can have a dimension of from 1 μm to 20 μm. A phosphor particle have a dimension of from 100 nm to 1 μm. A phosphor particles can be combination of phosphors having different particles sizes.

Suitable particles can have any suitable geometric profile. For example, particles can be substantially spherical, substantially non-spherical, rod-shaped, oblong, or flake.

Particles can have any suitable dimension. For example, particles can have dimensions, for example, from 1 nm to 1,000 nm, from 1 nm to 750 nm, from 1 nm to 500 nm, from 1 nm to 400 nm, from 1 nm to 300 nm, from 1 nm to 200 nm, from 1 nm to 100 nm, from 1 nm to 50 nm, or from 1 nm to 25 nm.

Selectively absorbing films can be used to increase the amount and density, such as vol %, of particles within a volume. Increasing the vol % loading of particles in a layer can be useful when the increasing the density can significantly increase a desired property of the layer. For example, increasing the density of an electrically conductive particles can dramatically increase the electrical conductivity of the volume. As another example, increasing the density of an electroactive particle such as a quantum dot, can dramatically increase the light output of the volume. For example, in display applications it can be useful to obtain a high light output per area. This can be achieved, with certain limitations, by increasing the number of light emitting materials underlying the area such as within a volume underlying the viewing area. A low vol % of the light emitting particles can require a higher volume to achieve a desired light output. However, in certain displays, having a thin dimensions can be desirable and therefore the intensity of a pixel cannot be increased by increasing the volume underlying the pixel. In such designs, it can be desirable to increase the vol % loading of the light emitting materials to obtain a desired light output in a small volume as determined by the dimensions of a thin display.

For certain applications it can be desirable to fill a volume such as a cavity in a substrate with a high volume of particles. High particle content increases the viscosity of a composition, and it is difficult to fill cavities using viscous materials. Although low viscosity materials and rheology modifiers can be used in the composition to mitigate the effects of high particle content, the content of the particles can be less than desirable.

One approach to increase the particle content of a deposited composition is to remove certain materials other than the particulates from the composition after it has been applied to a surface such as a cavity in the substrate. Removing certain materials from the deposited composition can reduce the volume of the remaining composition and thereby increase the vol % particle content of the modified composition, but not necessarily the vol % particle content of the initially filled volume such as a volume of a cavity. For example, removing 50 vol % of the low molecular weight, low viscosity, constituents of the initial composition will leave the cavity with the same vol % particulate content, and will leave the cavity only 50% filled.

The vol % particulate content of the cavity can then be increased by applying or depositing a second volume of the initial unmodified composition into the free volume in the cavity created by removing the low molecular weight components. In this way, the vol % particle content within the cavity can be increased by 50%. Further cycles of removing components of the initial composition and refilling the free volume can be used to increase the vol % particle content within the cavity.

Methods provided by the present disclosure can be used to increase the density of the particles in a deposited thin layer. For example, the thin layer can comprise particles and various other constituents such as constituents effective in reducing the viscosity of the particle-containing composition to facilitate depositing the thin film onto the substrate and in particular onto a structured substrate. After the filler-containing composition is deposited onto the substrate surface, a selectively absorbing layer can be applied to the thin film. The selectively absorbing film can abstract at least some of the non-filler content of the thin film such as solvent and low molecular weight species such as rheological control agents. For example, the selectively absorbing film can abstract from 1 vol % to 70 vol %, from 5 vol % to 60 vol %, from 10 vol % to 50 vol %, or from 20 vol % to 40 vol % of the constituents of the deposited thin film. The density of the filler can thereby be increased.

Particles includes surface-modified particles. Particle can be modified to improve the compatibility such as dispersibility, of the particles with the thin film composition, such as binding to the surrounding matrix. Particles can be modified to bind to other particles.

As can be appreciated, densifying electrically conductive and optically responsive particles can be used to improve the electronic and optical properties of the thin films into which they are incorporated. Densifying electrically conductive thin films can reduce the surface resistivity and through resistance, and densifying optically responsive particles can increase the light output power (LOP) per unit area.

In a deposited layer having a high vol % content of particles it can be useful to have a binder to maintain the integrity of the layer. Thus, it can be desirable that a certain amount of the co-reactive components forming the binder remain in the layer. The coreactive components can be small molecules, which remain in the modified coating after the selective absorption process. The coreactive components can be prepolymers, which remain in the modified coating after the selective absorption process.

A deposited layer can include particles and small molecules and a selectively absorbing film can absorb the small molecules to about the same extent. Thus, after the selective absorption process the composition of the small molecules will not change, and only the concentration of the filler in the coating will increase. In this example, the small molecules can include co-reactive components of a binder, solvent, rheology modifiers, and catalysts.

A deposited layer can include particles, large molecules, and small molecules and a selectively absorbing film can absorb primarily the small molecules. After the selective absorption process the small molecules will preferentially be removed, and the modified layer will include primarily the filler ant the large molecules. In this example, the large molecules can comprise coreactive components of the binder, and the small molecules can include solvent, rheology modifiers, and catalysts.

Depending on the size of the particles, removal of non-particle components of the layer can be facilitated by applying a vacuum to the selectively absorbing film. Components of the layer that are accessible to the pores of the absorbing film can be removed from the coating.

Figure 6A:
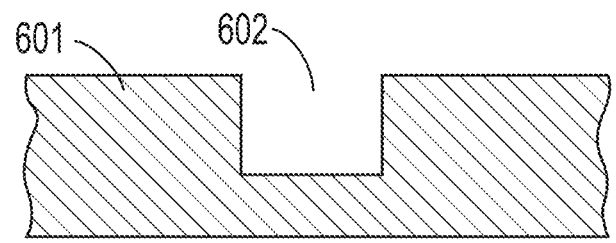
FIGS. 6A-6F show steps for modifying the composition of a layer using an absorbing film.
Figure 6B:
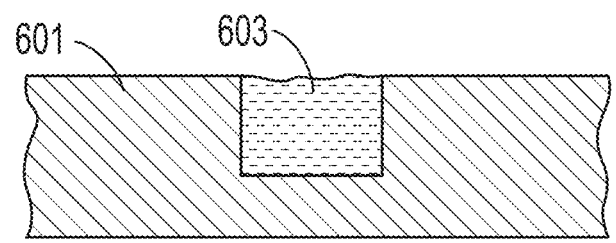
Figure 6C:
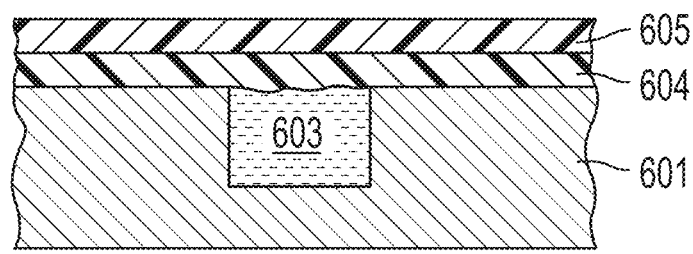
Figure 6D:
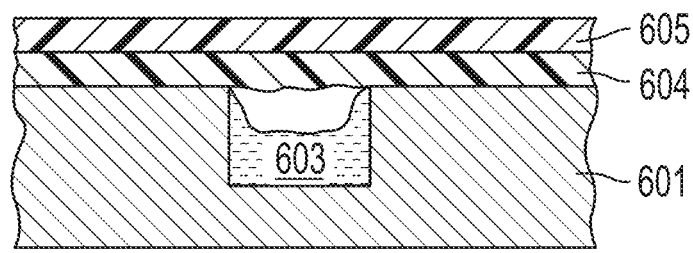
Figure 6E:
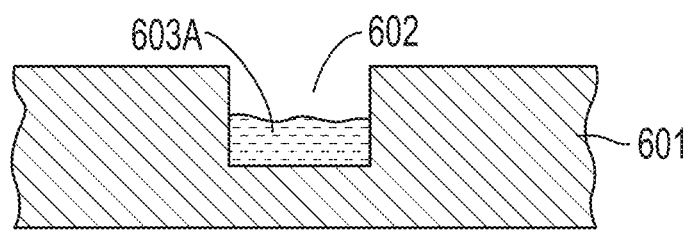
Figure 6F:
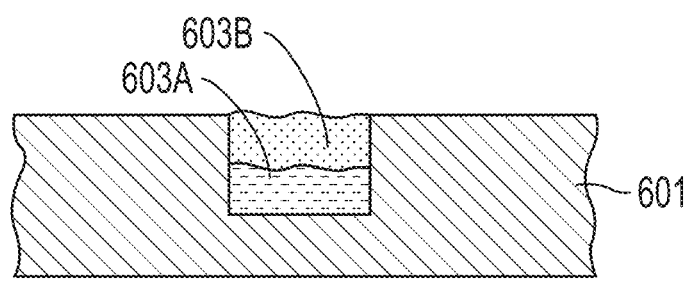

An example of a process flow for preparing a modified layer is shown in FIGS. 6A-6F. FIG. 6A shows a substrate 601 having an open well 602. The substrate can be any suitable material such as, for example, a metal or a semiconductor. As shown in FIG. 6B, layer of material 603 comprising, for example, particulates can be deposited within the well using any suitable method including those disclosed herein. As shown in FIG. 6C, after layer 603 is deposited within well 602, and absorbing film having a first layer 604 and a second layer 605 can be applied onto layer 603. Components from the deposited layer 603 can then be absorbed into the absorbing film 604/605 causing the volume of the absorbing film to decrease and effectively increasing the density of particulates within the layer. FIG. 6D shows an example of the structure during and/or following the absorption process. FIG. 6E shows a cross-section of modified layer 603A having a higher concentration of particulates and/or other component than in the initially deposited layer 603. As shown in FIG. 6F, another layer of material 603B can be applied onto modified layer 603A. Material 603B can have the same composition, for example, as material 603. In this way, the concentration of particulates and/or components can be increased within the well.

Methods provided by the present disclosure can be used to fabricate pixels of a display.

As an example, a periodic array of wells can be fabricated in a substrate in a desired arrangement for the display pixels. For example, wells can be 2 μm×2 μm wide and 2 um deep on a 5 um pitch and fabricated in a aluminum substrate.

Photo-responsive materials such as quantum dots can be deposited within the wells. When illuminated with a light source such as an LED the quantum dots can radiate at a desired wavelength depending on the composition and the structure of the quantum dot.

Lighting and display applications can include a wavelength conversion layer comprising phosphor particles, such as quantum dots, dispersed within a glass or polymer matrix. The phosphors can be arranged into groups of phosphors that emit a different color emission spectrum.

A light emitting device such as a display can include an array of pixels with each pixel comprising a plurality of subpixels designed for different color emission spectra. Each subpixel can comprise a well in a substrate containing phosphor particles, and different subpixels of a pixel can contain phosphor particles capable of emitting a different color emission spectrum.

Quantum dots can be applied to a substrate from a polymerizable composition. In addition to the quantum dots, the polymerizable composition can include co-reactive binders, cross-linking agents, scattering agents, rheology modifiers, catalysts, filler, photoinitiator, or combinations of any of the foregoing. The materials can be selected so as to absorb or to have minimal absorption at the irradiated wavelength and the emission wavelength of the quantum dots.

Other materials can be dispersed within the wavelength conversion layer. For example, a light scattering agent such as $TiO_2$ or $Al_2O_3$ particles can be dispersed within the wavelength conversion layer. Light scattering agents can increase the phosphor particle efficiency by increasing light scattering within the wavelength conversion layer. Light scattering agents can also reduce transmission of the incident light through the wavelength conversion layer. A pigment or dye can be dispersed within the wavelength conversion layer. A pigment can act as a color filter and can have, for example, a color similar to the emission wavelength of the phosphor particle. The pigment or dye can absorb at wavelength other than those being emitted from the phosphor particle, further narrowing the emission spectrum of the pixel.

For example, the other materials may be dispersed within the matrix material, such as glass or polymer matrix of the wavelength conversion layer.

A wavelength conversion layer can be incorporated into a variety of lighting or display devices. Examples of lighting applications include interior or exterior lighting applications, such as billboard lighting, building lighting, street lighting, light bulbs, and lamps. Examples of display applications include passive matrix display and active matrix displays, such as display signage, display panels, televisions, tablets, phones, laptops, computer monitors, kiosks, digital cameras, handheld game consoles, media displays, electronic book displays, and large area signage display.

EXAMPLES

Embodiments provided by the present disclosure are further illustrated by reference to the following examples, which describe methods, compositions, and devices provided by the present disclosure. It will be apparent to those skilled in the art that many modifications, both to materials, and methods, may be practiced without departing from the scope of the disclosure.

Example 1

Quantum Dot Optical Display

Quantum dot displays were fabricated using the materials and methods provided by the present disclosure.

The substrate consisted of an thick aluminum film with circular cavities having a 1.8 μm diameter and a depth of 1.6 μm on a 5 μm pitch.

The coating composition was prepared by combining one or more acrylates such as vinyl neodecanoate, hexylacrylate, octyl acrylate, lauryl acrylate, bornyl methacrylate, and/or hexadecene, a UV photoinitiator such as Irgacure® 179 and/or Irgacure® 1871, and quantum dots. The weight of the composition was about 1.5-times the weight of the quantum dots. The quantum dots formed a colloidal suspension, which was determined by the concentration at which the quantum dots began to precipitate. The composition included about 10 wt % of the photoinitiator.

The coating composition was applied to the substrate using a blade made of polydimethylsiloxane (Sylgard® 184, Dow Chemical). The coating composition was gently spread over the surface of the substrate by hand using the blade with a slight pressure.

The thin coating was applied to fill the cavities and to minimize the amount of ink outside the cavities and left on the top surface of the substrate.

Figure 3A:
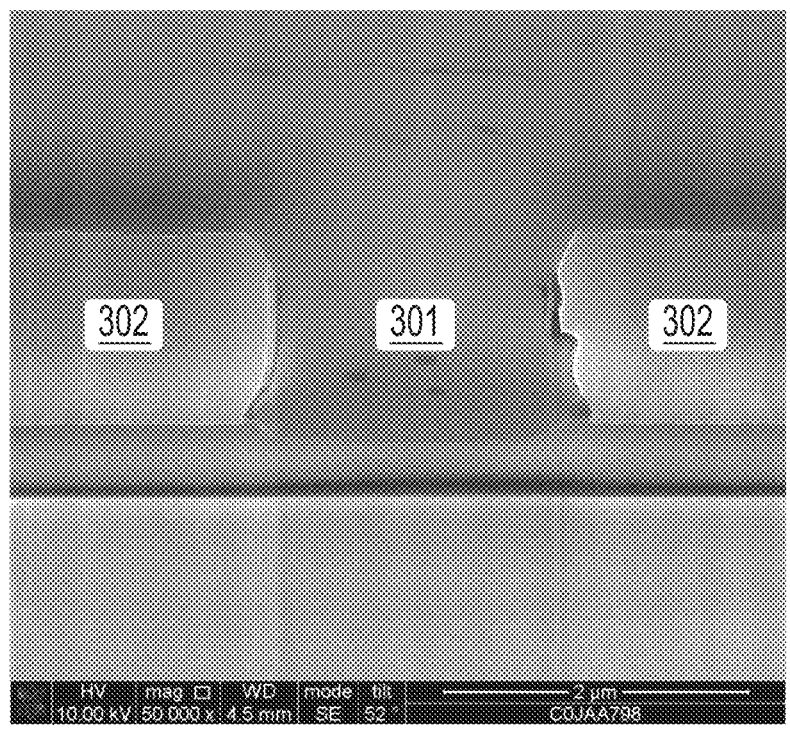
FIGS. 3A and 3B show cross-sectional views of a layer deposited within wells.
Figure 3B:
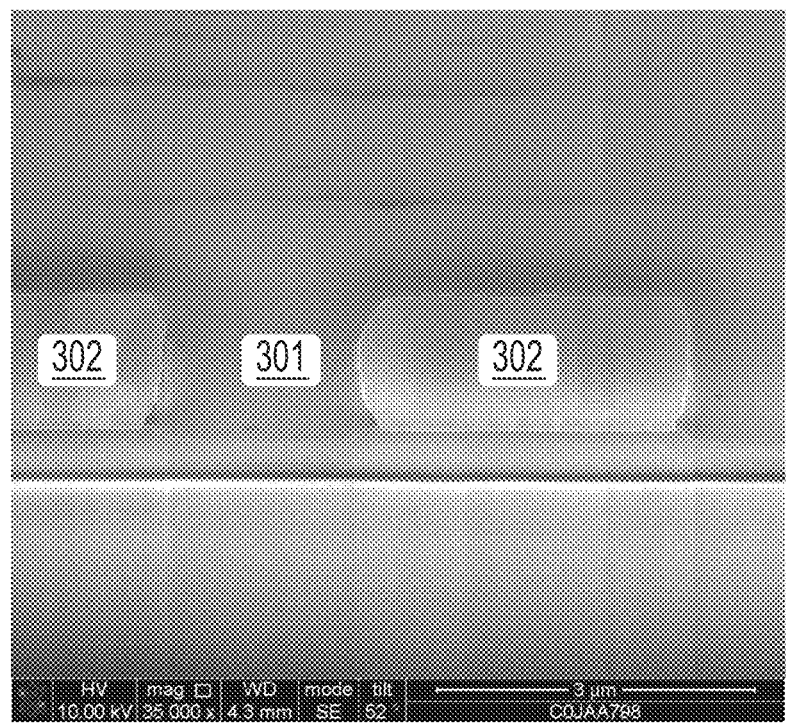

FIGS. 3A and 3B show photographs of cross-sections of cavities containing a thin layer after deposition and before a selectively absorbing film was applied to the deposited layer. The cavities 301 shown in the figures within the aluminum substrate 302 have a width of about 1.6 μm and a depth of about 1.6 μm. The composition comprising quantum dots is shown to completely fill the cavity.

A selectively absorbing film was prepared by molding a 500 μm thick sheet of Sylgard® 184 using the process recommended by the manufacturer.

The selectively absorbing film was applied to the quantum dot-containing layer by rolling the selectively absorbing film onto the surface.

After a period of time the selectively absorbing film was observed to swell and to increase in weight, indicating that components of the quantum dot-containing layer became absorbed into the selectively absorbing film.

As evidenced by the absence of fluorescence upon exposure to a blue light source (440 nm at 5 mW) the quantum dots did not adhere to the selectively absorbing film after it was removed.

Figure 4A:
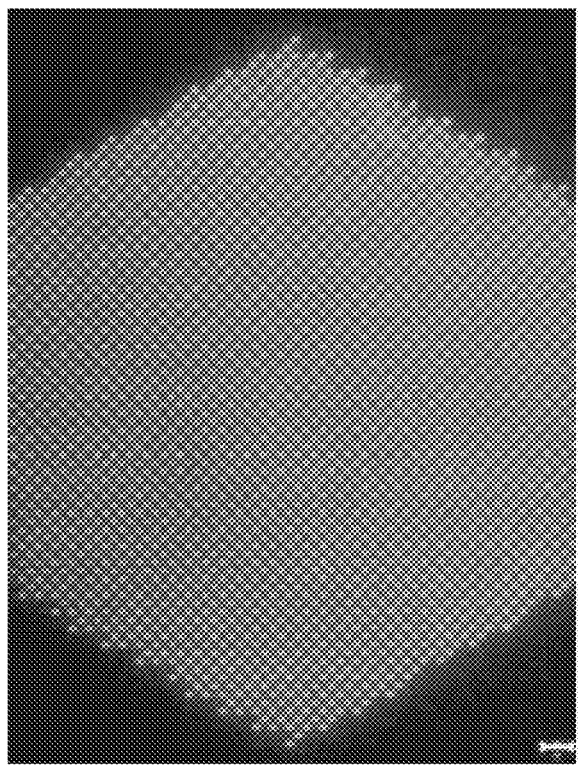
FIGS. 4A and 4B show photographs of a display comprising a plurality of 2 µm-wide, 2 µm-deep pixels fabricated using methods provided by the present disclosure.
Figure 4B:
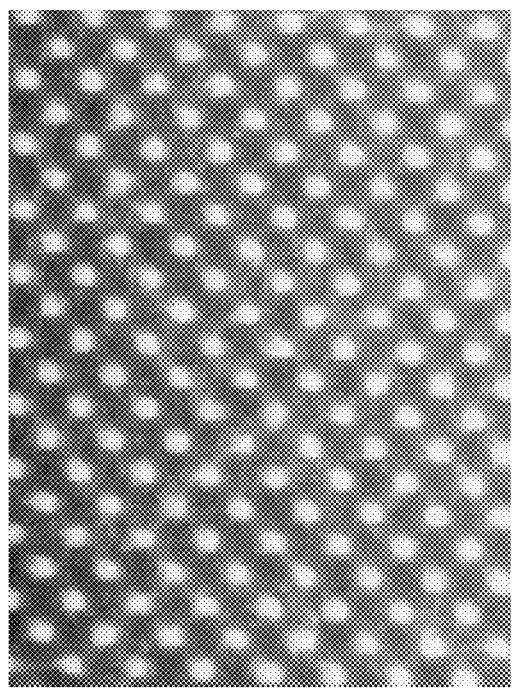

FIGS. 4A and 4B show photographs of a display comprising a plurality of 2 μm-wide, 2 μm-deep pixels fabricated using methods provided by the present disclosure. FIG. 4A shows a photograph of the display imaged with a 20× objective and FIG. 4B shows a portion of the display imaged with a 50× objective.

Figure 5A:
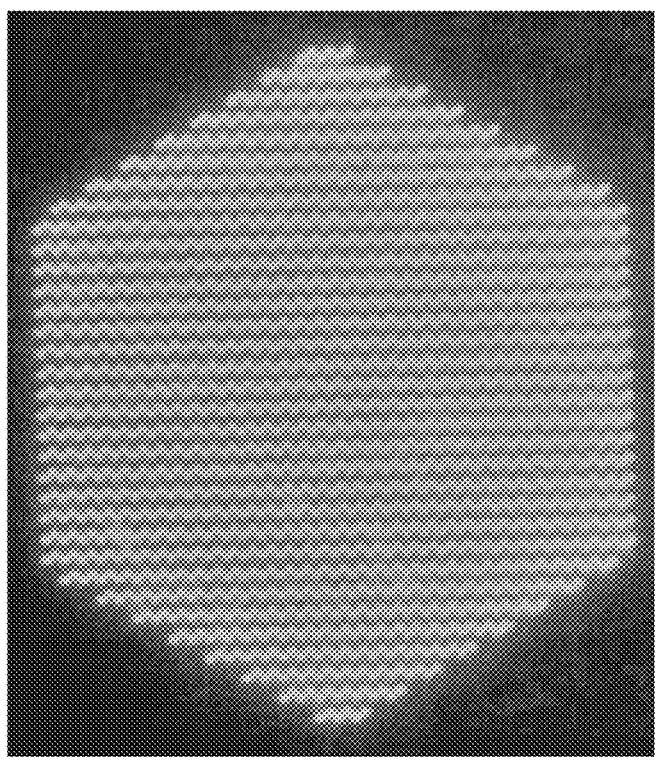
FIGS. 5A and 5B show photographs of another display comprising a plurality of 10 µm-wide, 2 µm-deep pixels fabricated using methods provided by the present disclosure.
Figure 5B:
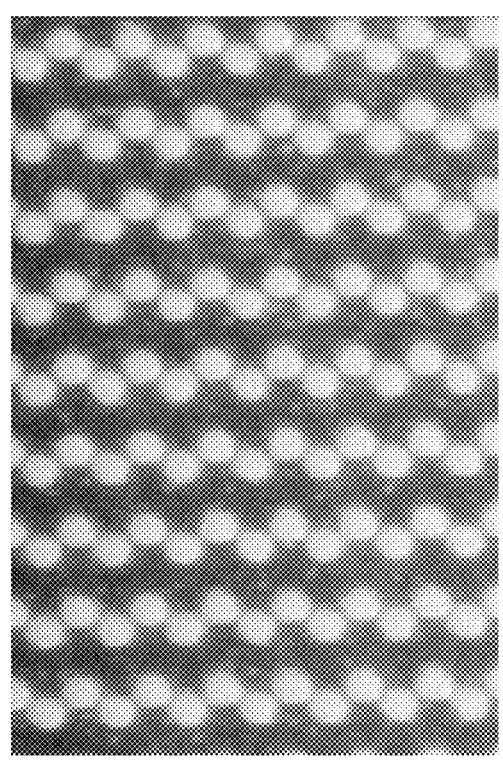

FIGS. 5A and 5B show photographs of another display comprising a plurality of 10 μm-wide, 2 μm-deep pixels fabricated using methods provided by the present disclosure. FIG. 5A shows a photograph of the display imaged with a 20× objective and FIG. 5B shows a portion of the display imaged with a 50× objective.

Aspects of the Invention

Aspect 1. A method of modifying the composition of a layer, comprising: (a) applying a selectively absorbing film in proximity to a layer, wherein the layer comprises a first composition, wherein the first composition comprises two or more components; and (b) modifying the first composition by causing at least one of the two or more components to absorb into the selectively absorbing film, causing a component to absorb into the first composition; or a combination thereof, to provide a modified layer, wherein the modified layer comprises a second composition.

Aspect 2. The method of aspect 1, wherein modifying comprises purifying the first composition, concentrating one or more components of the first composition, removing one or more components from the first composition, densifying a component of the first composition, introducing one or more components into the first composition, or a combination of any of the foregoing.

Aspect 3. The method of any one of aspects 1 to 2, wherein modifying comprises extracting one or more low molecular weight components from the first composition.

Aspect 4. The method of any one of aspects 1 to 3, wherein modifying comprises extracting, from the first composition, small molecules, prepolymers, solvents, rheology control agents, or a combination of any of the foregoing.

Aspect 5. The method of any one of aspects 1 to 4, wherein modifying comprises decreasing a volume of the layer.

Aspect 6. The method of any one of aspects 1 to 5, wherein modifying comprises concentrating one or more components of the first composition.

Aspect 7. The method of any one of aspects 1 to 6, wherein modifying comprises removing one or more components from the first composition.

Aspect 8. The method of any one of aspects 1 to 7, wherein modifying comprises adding one or more components to the first composition.

Aspect 9. The method of any one of aspects 1 to 8, wherein the first composition and the second composition comprise an unreacted thermoset composition.

Aspect 10. The method of any one of aspects 1 to 9, wherein the first composition comprises a vol % loading of particles from 1 vol % to 90 vol %.

Aspect 11. The method of any one of aspects 1 to 10, wherein the first composition comprises a first vol % of particles; the second composition comprises a second vol % of particles; and the second vol % is greater than the first vol %.

Aspect 12. The method of any one of aspects 10 to 11, wherein the particles comprises a photoactive material.

Aspect 13. The method of any one of aspects 10 to 12, wherein the particles comprise quantum dots.

Aspect 14. The method of any one of aspects 1 to 13, wherein the layer has a thickness from 1 μm to 500 μm.

Aspect 15. The method of any one of aspects 1 to 14, wherein the layer has a thickness less than 10 µm.

Aspect 16. The method of any one of aspects 1 to 15, wherein the layer comprises a continuous layer.

Aspect 17. The method of any one of aspects 1 to 16, wherein the layer comprises a discontinuous layer.

Aspect 18. The method of any one of aspects 1 to 17, wherein the layer is disposed within one or more recesses.

Aspect 19. The method of aspect 18, wherein the layer is disposed within one or more recesses, wherein the recesses have a depth from 1 µm to 4 µm and a width from 1 µm to 4 µm.

Aspect 20. The method of any one of aspects 1 to 19, wherein applying a selectively absorbing film in proximity to the layer comprises placing the film in contact with the layer.

Aspect 21. The method of any one of aspects 1 to 20, wherein applying a selectively absorbing film in proximity to the layer comprises placing the film near the layer.

Aspect 22. The method of any one of aspects 1 to 20, wherein applying a selectively absorbing film comprises placing a solid selectively absorbing film in proximity to the layer.

Aspect 23. The method of any one of aspects 1 to 22, wherein applying a selectively absorbing film comprises depositing a liquid film onto the layer.

Aspect 24. The method of aspect 23, further comprising curing the liquid film to provide a solid selectively absorbing film.

Aspect 25. The method of any one of aspects 1 to 24, wherein the selectively absorbing film comprises a single layer.

Aspect 26. The method of any one of aspects 1 to 24, wherein the selectively absorbing film comprises two or more layers.

Aspect 27. The method of any one of aspects 1 to 26, wherein applying the absorbing film comprises applying two or more selectively absorbing films sequentially.

Aspect 28. The method of any one of aspects 1 to 27, wherein applying comprises pressing the selectively absorbing film onto the layer Aspect 29. The method of any one of aspects 1 to 28, wherein the selectively absorbing film has a total thickness from 1 µm to 1 mm.

Aspect 30. The method of any one of aspects 1 to 29, wherein the selectively absorbing film is structured within the plane of the selectively absorbing film.

Aspect 31. The method of any one of aspects 1 to 30, wherein the selectively absorbing film comprises multiple layers.

Aspect 32. The method of any one of aspects 1 to 31, wherein the selectively absorbing film comprises: a release layer; one or more absorbing layers overlying the release layer; and a structural layer overlying the one or more absorbing layers.

Aspect 33. The method of aspect 32, wherein the release layer, the one or more absorbing layers, the structural layer, or a combination of any of the foregoing is field-responsive.

Aspect 34. The method of any one of aspects 1 to 33, wherein the selectively absorbing film comprises one or more field-responsive layers.

Aspect 35. The method of aspect 34, wherein the one or more field-response layers comprises a field-responsive compound.

Aspect 36. The method of aspect 35, wherein the field-responsive compound comprises liquid crystals, rotaxanes, field switchable molecules, or a combination of any of the foregoing.

Aspect 37. The method of any one of aspects 34 to 36, wherein each of the one or more field-responsive layers is configured to control a property of the field-responsive layer in response to an externally applied stimulus.

Aspect 38. The method of aspect 37, wherein the property comprises wetting, porosity, surface energy, surface charge, bulk modulus, surface stress, or a combination of any of the foregoing.

Aspect 39. The method of any one of aspects 37 to 38, wherein, each of the one or more field-responsive layers is configured to control the porosity of the selectively absorbing film; and the porosity is associated with a change in pore size distribution, channel connectivity, effective channel surface area, a change in surface affinity, or a combination of any of the foregoing.

Aspect 40. The method of any one of aspects 1 to 39, wherein causing comprises passive diffusion.

Aspect 41. The method of any one of aspects 1 to 39, wherein causing comprises active diffusion.

Aspect 42. The method of any one of aspects 1 to 41, wherein causing comprises maintaining a temperature of the layer at less than 30° C.

Aspect 43. The method of any one of aspects 1 to 41, wherein causing comprises maintaining a temperature of the layer from 20° C. to 28° C.

Aspect 44. The method of any one of aspects 1 to 41, wherein causing comprises heating the layer and the absorbing film.

Aspect 45. The method of any one of aspects 1 to 44, wherein causing comprises applying a vacuum to the selectively absorbing film.

Aspect 46. The method of any one of aspects 1 to 45, wherein causing comprises applying an electromagnetic field to the layer, the selectively absorbing film, or a combination thereof.

Aspect 47. The method of any one of aspects 1 to 45, wherein causing comprises applying an electrical field to the layer, the selectively absorbing film, or a combination thereof.

Aspect 48. The method of any one of aspects 1 to 45, wherein causing comprises applying a magnetic field to the layer, the selectively absorbing film, or a combination thereof.

Aspect 49. The method of any one of aspects 1 to 48, wherein the first composition comprises a first reactive component and a second reactive component, wherein the first reactive component is reactive with the second reactive component.

Aspect 50. The method of aspect 49, wherein each of the first reactive component and the second reactive component comprise a monomer, a copolymer, or a combination thereof.

Aspect 51. The method of any one of aspects 1 to 50, wherein each of the first composition and the second composition are curable using actinic radiation.

Aspect 52. The method of any one of aspects 1 to 51, wherein the first composition comprises a first viscosity, and the second composition comprises a second viscosity, wherein the first viscosity is less than the second viscosity.

Aspect 53. The method of any one of aspects 1 to 52, wherein the first composition comprises: a first concentration of a first component; and the second composition comprises a second concentration of the first component, wherein the second concentration is less than the first concentration.

Aspect 54. The method of any one of aspects 1 to 53, wherein a portion of the layer has a first volume, and the portion of the modified layer corresponding to the portion of the layer has a second volume, wherein the second volume is less than the first volume.

Aspect 55. The method of aspect 54, wherein the second volume is less than 75% of the first volume.

Aspect 56. The method of aspect 54, wherein the second volume is less than 50% of the first volume.

Aspect 57. The method of any one of aspects 1 to 56, wherein each of the first composition and the second composition comprise particles.

Aspect 58. The method of claim 1, wherein the particles comprise photoactive particles, electroactive particles, or a combination thereof.

Aspect 59. The method of any one of aspects 1 to 58, wherein the first composition comprises a first concentration of particles; the modified layer comprises a second concentration of particles; wherein the second concentration is greater than the first concentration.

Aspect 60. The method of any one of aspects 1 to 59, wherein the selectively absorbing film comprises one or more layers wherein each of the one or more layers independently comprises a polymer of intrinsic microporosity (PIMs), a porous organic polymer (POP), a polysiloxanes, a metal organic framework (MOFs), a porous coordination polymers (PCPs), or a combination of any of the foregoing.

Aspect 61. The method of any one of aspects 1 to 60, wherein the selectively absorbing film comprises a silicone.

Aspect 62. A modified layer fabricated using the method of any one of aspects 1 to 61.

Aspect 63. A cured modified layer prepared by curing the modified layer of aspect 62.

Aspect 64. An electronic device comprising the cured modified layer of aspect 63.

Aspect 65. The electronic device of aspect 64, wherein the electronic device comprises an optoelectronic device.

Aspect 66. The electronic device of aspect 64, wherein the electronic device comprises a display or a lighting device.

Aspect 67. An electronic system comprising the electronic device of any one of aspects 64 to 66.

Aspect 68. A selectively absorbing film, comprising one or more absorbing layers.

Aspect 69. A method of fabricating one or more pixels, comprising: providing a substrate comprising one or more recesses, wherein each of the one or more recesses defines a pixel; depositing a first composition into each of the one or more recesses, wherein the first composition comprises one or more components; applying a selectively absorbing film in proximity to the deposited first composition; and causing one or more components of the deposited first composition to absorb into the selectively absorbing film, to provide one or more pixels comprising a modified first composition.

Aspect 70. The method of aspect 69, wherein causing produces a free volume within each of the one or more recesses, and the method further comprises depositing a second composition into the free volume within each of the one or more recesses.

Aspect 71. The method of any one of aspects 69 to 70, wherein the second composition and the first composition are the same.

Aspect 72. The method of any one of aspects 69 to 70, wherein the second composition and the first composition are different.

Aspect 73 The method of any one of aspects 69 to 72, further comprising: applying a selectively absorbing film in proximity to the deposited second composition; and causing one or more components of the deposited second composition to absorb into the selectively absorbing film.

Aspect 74. The method of any one of aspects 69 to 73, wherein the first composition comprises a plurality of particles.

Aspect 75. The method of any one of aspects 69 to 74, wherein the first composition comprises a plurality of quantum dots.

Aspect 76. The method of any one of aspects 69 to 75, wherein, the first composition comprises a first vol % of the particles; and the modified first composition comprises a second vol % of particles, wherein the second vol % is greater than the first vol %, wherein vol % is based on the volume of the first composition and the volume of the modified composition, respectively Aspect 77. The method of any one of aspects 69 to 76, wherein, a recess comprising the first composition comprises a first vol % of the particles; the pixel has a second vol % of the particles, the second vol % is greater than the first vol %, wherein vol % is based on the volume of the recess.

Aspect 78. The method of any one of aspects 69 to 77, wherein each of the one or more recesses comprises a width from 1 µm to 4 µm and a depth from 1 µm to 4 µm.

Aspect 79. The method of any one of aspects 69 to 78, wherein each of the one or more pixels is characterized by a conversion efficiency from 40% to 80%, Aspect 80. A pixel fabricated using the method of any one of aspects 69 to 79.

Aspect 81. The pixel of aspect 80, wherein the pixel has a volume from 1 µm$^3$ to 30 µm$^3$, and a quantum efficiency greater than 75%.

Aspect 82. The pixel of any one of aspects 80 to 81, wherein the pixel comprises a plurality of quantum dots.

Aspect 83. The pixel of any one of aspects 80 to 82, wherein the pixel comprises from 70 vol % to 90 vol % of the quantum dots.

Aspect 84. An electronic device comprising the pixel of any one of aspects 80 to 83.

Aspect 85. The electronic device of aspect 84, wherein the electronic device comprises an optoelectronic device.

Aspect 86. The electronic device of aspect 84, wherein the electronic device comprises a display or a lighting device.

Aspect 87. An electronic system comprising the electronic device of any one of aspects 84 to 86.

Aspect 1A. A method of modifying the composition of a layer, comprising: (a) applying a selectively absorbing film in proximity to a layer, wherein the layer comprises a first composition, wherein the first composition comprises particles and at least one additional component; and (b) modifying the first composition by causing at the at least one additional component to absorb into the selectively absorbing film; to provide a modified layer, wherein the modified layer comprises a second composition comprising particles.

Aspect 2A. The method of aspect 1A, wherein modifying comprises concentrating the particles, removing the at least one additional component from the first composition, or a combination thereof.

Aspect 3A. The method of any one of aspects 1A to 2A, wherein modifying comprises extracting one or more low molecular weight components from the first composition.

Aspect 4A. The method of any one of aspects 1A to 3A, wherein modifying comprises decreasing a volume of the layer.

Aspect 5A. The method of any one of aspects 1A to 4A, wherein modifying comprises concentrating the particles in the first composition.

Aspect 6A. The method of any one of aspects 1A to 5A, wherein modifying comprises removing one or more components from the first composition.

Aspect 7A. The method of any one of aspects 1A to 6A, wherein the first composition comprises a first vol % of the particles; the second composition comprises a second vol % of the particles; and the second vol % is greater than the first vol %.

Aspect 8A. The method of any one of aspects 1A to 7A, wherein the particles comprise a photoactive material.

Aspect 9A. The method of any one of aspects 1A to 8A, wherein the particles comprise quantum dots.

Aspect 10A. The method of any one of aspects 1A to 9A, wherein the layer is disposed within one or more recesses.

Aspect 11A. The method of any one of aspects 1A to 10A, wherein the layer is disposed within one or more recesses, wherein the recesses have a depth from 1 μm to 4 μm and a width from 1 μm to 4 μm.

Aspect 12A. The method of any one of aspects 1A to 11A, wherein the first composition comprises: a first concentration of a first component; and the second composition comprises a second concentration of the first component, wherein the second concentration is less than the first concentration.

Aspect 13A. The method of any one of aspects 1A to 12A, wherein a portion of the layer has a first volume, and the portion of the modified layer corresponding to the portion of the layer has a second volume, wherein the second volume is less than the first volume.

Aspect 14A. The method of any one of aspects 1A to 13A, wherein the first composition comprises a first concentration of the particles; the modified layer comprises a second concentration of the particles; wherein the second concentration is greater than the first concentration.

Aspect 15A. A modified layer fabricated using the method of any one of aspects 1A to 14A.

Aspect 16A. A cured modified layer prepared by curing the modified layer of aspect 15A.

Aspect 17A. An electronic device comprising the cured modified layer of aspect 16A.

Aspect 18A. A method of fabricating one or more pixels, comprising: providing a substrate comprising one or more recesses, wherein each of the one or more recesses defines a pixel; depositing a first composition into each of the one or more recesses, wherein the first composition comprises particles and one or more additional components; applying a selectively absorbing film in proximity to the deposited first composition; and causing one or more of the additional components of the deposited first composition to absorb into the selectively absorbing film, to provide one or more pixels comprising a modified first composition.

Aspect 19A. The method of aspect 18A, wherein, the first composition comprises a first vol % of the particles; and the modified first composition comprises a second vol % of particles, wherein the second vol % is greater than the first vol %, wherein vol % is based on the volume of the first composition and the volume of the modified composition, respectively Aspect 20A. The method of any one of aspects 18A to 19A, further comprising: depositing a second composition onto the modified first composition, wherein the second composition comprises particles and one or more additional components; applying a selectively absorbing film in proximity to the deposited second composition; and causing one or more of the additional components of the deposited second composition to absorb into the selectively absorbing film, to provide one or more pixels comprising the modified first composition and a modified second composition.

Aspect 21A. The method of any one of aspects 18A to 20A, wherein the particles comprises a photoactive material.

Aspect 22A. The method of any one of aspects 18A to 21A, wherein the particles comprise quantum dots.

Aspect 23A. A pixel fabricated using the method of any one of aspects 18A to 22A.

Aspect 24A. The pixel of aspect 23A, wherein the particles comprise a plurality of quantum dots.

Aspect 25A. An electronic device comprising the pixel of any one of aspects 23A to 24A.

Finally, it should be noted that there are alternative ways of implementing the embodiments disclosed herein. Accordingly, the present embodiments are to be considered as illustrative and not restrictive. Furthermore, the claims are not to be limited to the details given herein, and are entitled to their full scope and equivalents thereof.

What is claimed is:

1. A method of increasing the vol % of quantum dots in a first composition, comprising:
   (a) applying a selectively absorbing film in proximity to the first composition, wherein the first composition comprises a first vol % of quantum dots and at least one additional component, wherein the first vol % of quantum dots is based on the total volume of the first composition; and
   (b) modifying the first composition by causing the at least one additional component to absorb into the selectively absorbing film to provide a second composition, wherein,
   the second composition comprises a second vol % of the quantum dots, wherein the second vol % of quantum dots is based on the total volume of the second composition; and
   the second vol % is greater than the first vol %; and
   the at least one additional component comprises an acrylate monomer.

2. The method of claim 1, wherein modifying comprises extracting the at least one additional component from the first composition.

3. The method of claim 2, wherein the at least one additional component comprises a low molecular weight component.

4. The method of claim 1, wherein modifying comprises decreasing a volume of the first composition.

5. The method of claim 1, wherein the first composition is in the form of a layer.

6. The method of claim 1, wherein the first composition is disposed within a recess.

7. The method of claim 6, wherein the recess has a depth from 1 μm to 10 μm and a width from 1 μm to 10 μm.

8. The method of claim 7, wherein the recess has a depth that is greater than the width.

9. The method of claim 1, wherein the first composition comprises:
   a first concentration of a first component; and
   the second composition comprises a second concentration of the first component,
   wherein the second concentration is less than the first concentration.

10. The method of claim 1, wherein,
the first composition has a first volume;
the second composition has a second volume; and
the second volume is less than the first volume.

11. The method of claim 1, wherein,
the first composition comprises a first wt % of quantum dots, wherein the first wt % is based on the total weight of the first composition;
the second composition comprises a second wt % of quantum dots, wherein the second wt % is based on the total weight of the modified composition; and
the second wt % is greater than the first wt %.

12. The method of claim 1, wherein the selectively absorbing film comprises a silicone polymer.

13. The method of claim 1, wherein the selectively absorbing film comprises multiple layers.

* * * * *